(12) United States Patent
Katsuyama

(10) Patent No.: US 7,816,157 B2
(45) Date of Patent: Oct. 19, 2010

(54) METHOD OF PRODUCING SEMICONDUCTOR OPTICAL DEVICE

(75) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 124 days.

(21) Appl. No.: 12/364,718

(22) Filed: Feb. 3, 2009

(65) Prior Publication Data

US 2009/0203159 A1   Aug. 13, 2009

(30) Foreign Application Priority Data

Feb. 12, 2008   (JP) .............................. 2008-030694

(51) Int. Cl.
*H01L 21/20* (2006.01)
(52) U.S. Cl. ........................... 438/29; 438/41; 438/507; 257/E21.131
(58) Field of Classification Search ................. 438/29, 438/41, 503, 507, 509; 257/E21.131
See application file for complete search history.

(56) References Cited

U.S. PATENT DOCUMENTS 6,790,697 B2 * 9/2004 Kobayashi et al. ............ 438/44
7,125,735 B2 * 10/2006 Takeuchi ..................... 438/41
7,596,160 B2 * 9/2009 Tsuchiya et al. ......... 372/45.01
2009/0087966 A1 * 4/2009 Watatani et al. ............. 438/494

OTHER PUBLICATIONS

K. Hinzer et al., Technical Digest of Optical Fiber Communication, 2003, FG7. pp. 684-685.

* cited by examiner

*Primary Examiner*—Tuan N. Quach
(74) *Attorney, Agent, or Firm*—Smith, Gambrell & Russell, LLP

(57) ABSTRACT

The invention discloses a method of producing on a substrate a semiconductor optical device having a laser diode and an EA optical modulator. An etched side face of a first semiconductor portion is formed. Then, for example, a first optical confinement layer and an active layer both for the EA optical modulator are grown by the metal organic vapor phase epitaxy method. The first optical confinement layer is grown by supplying hydrogen chloride in addition to a material gas. When the first optical confinement layer is grown, the formation of a thick semiconductor layer along the etched side face, which is an abnormally grown semiconductor layer, is decreased. Subsequently, the active layer for the EA optical modulator is grown. This method can suppress the active layer for the EA optical modulator from bending caused by the abnormally grown semiconductor layer.

16 Claims, 8 Drawing Sheets

METHOD OF PRODUCING SEMICONDUCTOR OPTICAL DEVICE

BACKGROUND OF THE INVENTION

1. Field of the Invention

The present invention relates to a method of producing a semiconductor optical device.

2. Description of the Background Art

K. Hinser et al. have described a buried heterostructure (BH) laser diode and a production method thereof using the vapor-phase etching technique in a literature reported in Technical Digest of Optical Fiber Communication, 2003, FG7, pp. 684-685. The method of producing a laser diode using the vapor-phase etching technique described in the foregoing literature is explained below. First, a semiconductor laminate is formed on a substrate. Next, a stripe-shaped mask made of $SiO_2$ is formed on the semiconductor laminate. The wafer having the stripe mask is loaded into a metal organic vapor phase epitaxy reactor. Subsequently, methyl iodide and $PH_3$ are concurrently supplied into the reactor. The semiconductor laminate on which the stripe mask is formed is etched by an etching gas composed of the methyl iodide. Thus, a mesa is formed. Directly after the mesa is formed, without taking out the wafer from the reactor, a p-type current-blocking layer and an n-type current-blocking layer are formed on the side face of the mesa.

SUMMARY OF THE INVENTION

An aspect of the present invention is a method of producing an integrated semiconductor optical device. The method is provided with the following steps:

(a) preparing a substrate having a main surface having:
  (a1) a first area for forming a first semiconductor optical device to be included in the integrated semiconductor optical device; and
  (a2) a second area for forming a second semiconductor optical device to be included in the integrated semiconductor optical device;
(b) forming on the substrate a semiconductor laminate for forming the first semiconductor optical device;
(c) forming an insulating-film mask on the semiconductor laminate on the first area;
(d) etching the semiconductor laminate by using the insulating-film mask to form on the first area a first semiconductor portion having a side face extending in a specified direction perpendicular to the main surface;
(e) after the etching of the semiconductor laminate, selectively growing a first semiconductor layer for the second semiconductor optical device by a metal organic vapor phase epitaxy method while leaving the insulating-film mask unchanged; and
(f) while leaving the insulating-film mask unchanged, selectively growing on the first semiconductor layer a second semiconductor layer for the second semiconductor optical device.

For growing the first semiconductor layer, an etching gas containing a halogen element is supplied in addition to a material gas for the growing of the first semiconductor layer.

According to the method of the present invention for producing a semiconductor optical device, the semiconductor laminate for forming the first semiconductor optical device is etched using the insulating-film mask. Then, the first semiconductor layer for forming the second semiconductor optical device is selectively grown on the second area while leaving the insulating-film mask unchanged. In growing the first semiconductor layer, hydrogen chloride is supplied in addition to a material gas. No semiconductor layer is grown on the insulating-film mask. The material gas flows into the second area without being consumed on the insulating-film mask. Similarly, the etching gas containing a halogen element supplied onto the insulating-film mask also flows into the second area without being consumed on the insulating-film mask. The supplying of the etching gas containing a halogen element suppresses the semiconductor layer from growing with an increased thickness along the side face of the first semiconductor portion. As a result, the bending of the second semiconductor layer grown on the first semiconductor layer can be decreased at the side face of the first semiconductor portion.

According to the method of the present invention, in the step of growing the first semiconductor layer, the mixing ratio of the material gas and the etching gas containing a halogen element may be controlled. The controlling of the mixing ratio of the material gas and the etching gas containing a halogen element can control the deposition of the semiconductor layer along the side face of the first semiconductor portion. As a result, the first semiconductor layer having a flat surface can be grown.

According to the method of the present invention, in the step of growing the first semiconductor layer, the growing temperature of the first semiconductor layer may be set in the range of 600° C. to 640° C. This method enables the growing of the first semiconductor layer having a flat surface.

According to the method of the present invention, the first semiconductor layer for the second semiconductor optical device may include a buffer layer. The buffer layer may be made of, for example, InP. In addition, the first semiconductor layer may include an optical confinement layer. The optical confinement layer may be made of for example, InGaAsP. According to this method, when the buffer layer or the optical confinement layer both for the second semiconductor optical device is grown, the growing of the semiconductor layer and the etching of the deposited semiconductor layer can be performed concurrently. Therefore, it is suppressed that the first semiconductor layer is grown with an increased thickness along the side face of the first semiconductor portion.

According to the method of the present invention, the second semiconductor layer for the second semiconductor optical device may be an active layer. This method can decrease the bending of the active layer forming the optical waveguide. Consequently, the optical coupling loss at the boundary between the first and second semiconductor optical devices can be decreased. The active layer for the second semiconductor optical device may have a multiquantum well structure made of InGaAsP.

According to the method of the present invention, for growing the second semiconductor layer, an etching gas containing a halogen element may be supplied in addition to the material gas. According to this method, when not only is the first semiconductor layer grown but also the second semiconductor layer is grown, an etching gas containing a halogen element may be supplied in addition to the material gas.

According to the method of the present invention, the method may further be provided with a step of growing on the second semiconductor layer a third semiconductor layer for the second semiconductor optical device by a metal organic vapor phase epitaxy method. For growing the third semiconductor layer, an etching gas containing a halogen element may be supplied in addition to the material gas for the growing. According to the method, when not only is the first semiconductor layer grown but also the third semiconductor layer is grown, an etching gas containing a halogen element may be supplied in addition to the material gas.

According to the method of the present invention, the semiconductor sector may include an active layer for the first semiconductor optical device. This method can decrease the bending of the first semiconductor layer caused by a deposited semiconductor layer along the side face. Consequently, it becomes easy to align the height of the active layer for the second semiconductor optical device with the height of the active layer for the first semiconductor optical device. The active layer for the first semiconductor optical device may have a multiquantum well structure made of InGaAsP.

According to the method of the present invention, one of the first and second semiconductor optical devices may include a laser diode and the other one may include an electroabsorption optical modulator. This method is particularly useful when a semiconductor optical device to be produced has a laser diode and an electroabsorption optical modulator. The first and second semiconductor optical devices may be optically coupled together through a butt-joint structure.

According to the method of the present invention, as the etching gas containing a halogen element, hydrogen chloride may be used. When hydrogen chloride having a concentration of 5% is used, it is desirable to feed the hydrogen chloride at a flow rate of at most 20 sccm (standard cubic centimeter per minute). According to this method, when a semiconductor layer is grown by supplying an etching gas containing a halogen element in addition to the material gas, the growth rate of the semiconductor layer is stabilized.

The above-described objects, other objects, features, and advantages of the present invention are more easily clarified through the following detailed description of desirable embodiments of the present invention, the following detailed description being stated by referring to the attached drawing.

BRIEF DESCRIPTION OF THE DRAWING

FIG. 2b is a cross-sectional view for explaining the foregoing method in succession to FIG. 2a.

FIG. 3b is a cross-sectional view for explaining the foregoing method in succession to FIG. 3a.

DETAILED DESCRIPTION OF THE INVENTION

Figure 1A:
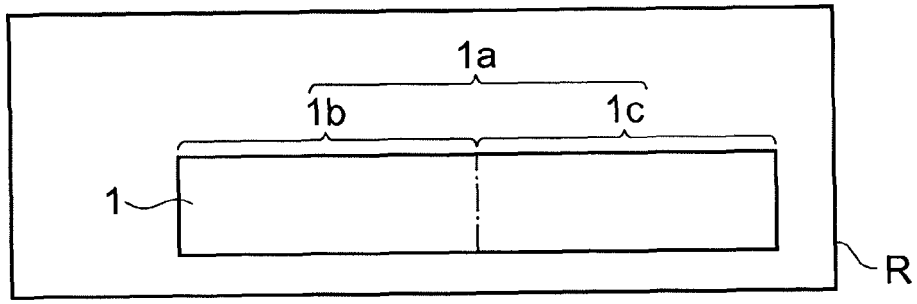
FIG. 1a is a cross-sectional view for explaining a method of producing a semiconductor optical device.

The expertise of the present invention can be easily understood through the following detailed description in consultation with the accompanying drawing that shows an example. Embodiments of the present invention are explained below by referring to the attached drawing. In the drawing, whenever possible, the same item bears the same numeral or sign to eliminate duplicated explanations. The scale in the drawing does not necessarily coincide with that of the explanation.

The well-known integrated semiconductor optical device has a laser diode and an electroabsorption (EA) optical modulator which are integrated on a single substrate. This integrated semiconductor optical device has a butt-joint structure to optically couple the laser diode and the EA optical modulator with each other. This structure is produced by the following method, for example. First, a first semiconductor laminate composed of a plurality of semiconductor films of an n-type cladding layer, an active layer, and a p-type cladding layer is grown on a substrate to form a laser diode. Then, an insulating-film mask to form the laser diode is formed on the first semiconductor laminate. By using the mask, the first semiconductor laminate is etched through the reactive-ion etching (RIE) method, for example. A side face of the first semiconductor laminate is formed by this RIE etching. Finally, a second semiconductor laminate for the EA optical modulator is grown on the area where the first semiconductor laminate is removed by the RIE etching.

In the conventional method of producing an integrated optical device, the second semiconductor laminate is grown on the area removed by RIE etching. In addition, the second semiconductor laminate is also grown abnormally along the foregoing side face. As a result of this abnormal growth, a deposited semiconductor layer rises gradually along the side face of the first semiconductor laminate. Such an abnormal growth is caused by the following reason. When a material gas is supplied into a metal organic vapor phase epitaxial (MOVPE) furnace to grow a semiconductor layer on the substrate on which an insulating-film mask is partially formed, no semiconductor layer is grown on the insulating-film mask. The material gas flows along the insulating-film mask and arrives at the semiconductor surface uncovered by the insulating-film mask. The material gas is adsorbed on the semiconductor surface of the substrate. Thus, a semiconductor layer is selectively grown on the substrate uncovered by the insulating-film mask. Consequently, the material gas is accumulated with an increased amount at the boundary between the area covered by the insulating-film mask and the area uncovered by it. In the process for forming the integrated optical device, the side face is formed at the boundary between the area for the EA optical modulator and the area for the laser diode in the substrate. Therefore, an increased amount of material gas is accumulated in the vicinity of the side face. The deposited semiconductor layer in the area for the EA optical modulator is also grown along the side face of the first semiconductor laminate.

More specifically, when semiconductor layers for forming the EA optical modulator are grown on the substrate, the first layer, which is a cladding layer, for example, grows with a greater thickness in the vicinity of the boundary than the thickness of the layer growing on the flat substrate. The active layer for the EA optical modulator is successively grown on the first layer, and the active layer is bent in the vicinity of the side face due to the deposited semiconductor layer at the boundary face. Consequently, the active layer for the laser diode cannot be aligned with the active layer for the EA optical modulator in the vicinity of the boundary. As a result, a butt-joint structure having a good optical coupling efficiency between the laser diode and the EA optical modulator cannot be produced.

In the method of producing an integrated semiconductor optical device having a plurality of semiconductor optical devices on a substrate, the present invention discloses a method of producing an integrated semiconductor optical device that can decrease the bending of the semiconductor layer and that has a good coupling efficiency. The method of the present invention for producing the integrated semiconductor optical device is explained below in detail.

FIGS. 1a to 8d are diagrams schematically showing the cross sections and structures in the production steps for explaining the method of producing the semiconductor optical device in an embodiment of the present invention. In the following explanation for an example, a laser diode (LD) as a first semiconductor optical device and an electroabsorption (EA) optical modulator as a second semiconductor optical device are formed on a substrate.

As shown in FIG. 1a, a semiconductor substrate 1 is prepared. The semiconductor substrate 1 is, for example, an InP semiconductor substrate. In the following explanation, an integrated optical device is formed on the InP semiconductor substrate 1. The semiconductor substrate 1 has a first substrate region and a second substrate region both arranged along a predetermined reference plane. The first and second substrate regions appear as a first area and a second area, respectively, on a main surface of the semiconductor substrate 1. A main surface 1a of the semiconductor substrate 1 has a first area (hereinafter referred to as an LD area) 1b for forming a laser diode and a second area (hereinafter referred to as an EA area) 1c for forming an EA optical modulator. The chain single-dashed line drawn in Figures, for example, in FIG. 1a, shows a boundary line between the LD area 1b and the EA area 1c.

Semiconductor layers are grown on the entire surface of the main surface 1a of the InP semiconductor substrate 1 by the metal organic vapor phase epitaxy (MOVPE) method. For example, trimethylgallium (TMGa), trimethylindium (TMIn), phosphin ($PH_3$), and arsine ($AsH_3$) may be used as a gallium material, an indium material, a phosphorus material, and an arsenic material, respectively.

Figure 1B:
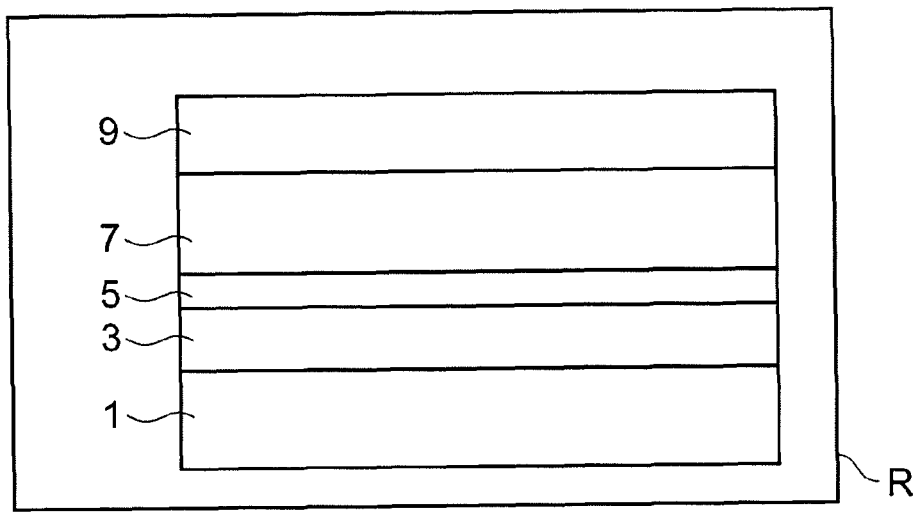
FIG. 1b is a cross-sectional view for explaining the foregoing method in succession to FIG. 1a, and FIG. 1c is a cross-sectional view for explaining the foregoing method in succession to FIG. 1b.

As shown in FIG. 1b, a buffer layer 3, a first optical confinement layer 5, an active layer 7, and a second optical confinement layer 9 are grown in this order on the entire surface of the main surface 1a of the InP semiconductor substrate 1. The growth of these semiconductor layers is carried out by using a crystal-growing apparatus such as an MOVPE apparatus. The buffer layer 3 has a thickness of, for example, 550 nm and is formed of a Si-doped InP film. In this embodiment, the buffer layer 3 has a carrier concentration of for example, $1.1 \times 10^{+18}$ cm$^{-3}$. The first optical confinement layer 5 and the second optical confinement layer 9 are each formed of an InGaAsP film having a bandgap wavelength of 1,150 nm and a thickness of 100 nm.

The active layer 7 is composed of, for example, InGaAsP. The active layer 7 has a multiquantum well (MQW) structure. The MQW structure has alternately placed barrier layers and well layers. For example, it is composed of eight well layers and nine barrier layers. In this embodiment, each barrier layer has a bandgap wavelength of 1,200 nm and a thickness of 10 nm. Each well layer has a bandgap wavelength of 1,550 nm, a thickness of 5 nm, and a compressive strain of 1.0%. The active layer 7 is grown at a temperature of 670° C., and its growth rate is controlled within the range of 1.2 to 1.5 µm/hr.

Figure 1C:
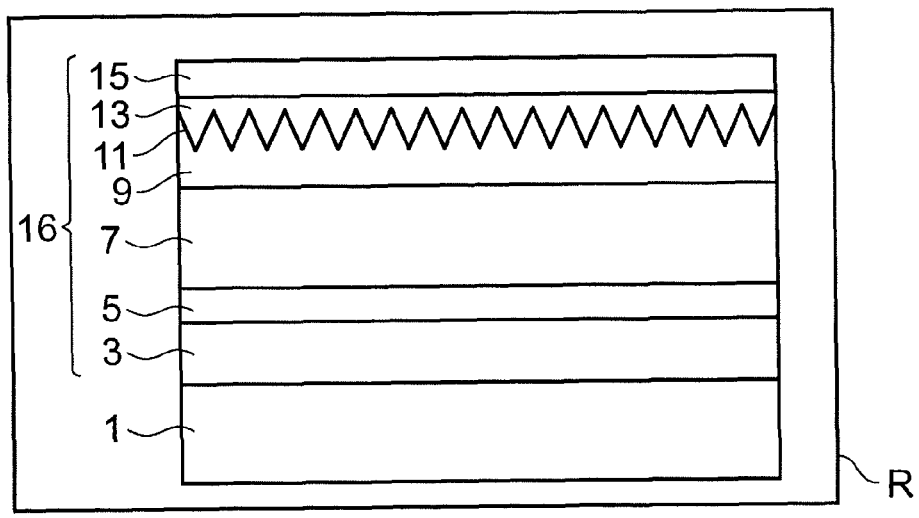

As shown in FIG. 1c, a periodic structure for a diffraction grating 11 is formed on the second optical confinement layer 9. A cladding layer 13 is deposited on the periodic structure to form the diffraction grating 11. The cladding layer 13 has a thickness of for example, 240 nm and is composed of Zn-doped InP. The diffraction grating 11 has a period of, for example, 242 nm. The cladding layer 13 has a carrier concentration of, for example, $6.5 \times 10^{+17}$ cm$^{-3}$. A cap layer 15 is formed on the cladding layer 13. The cap layer 15 has a thickness of, for example, 100 nm and is composed of Zn-doped InGaAs. The cap layer 15 has a carrier concentration of, for example, $2.0 \times 10^{+17}$ cm$^{-3}$. The growth of the cladding layer 13 and the cap layer 15 completes the formation of a semiconductor laminate 16. The semiconductor laminate 16 is provided on the first and second substrate regions of the substrate 1. The semiconductor laminate 16 has a first portion 16a and a second portion 16b (see FIG. 2a) positioned on the LD area 1b and the EA area 1c, respectively.

Figure 2A:
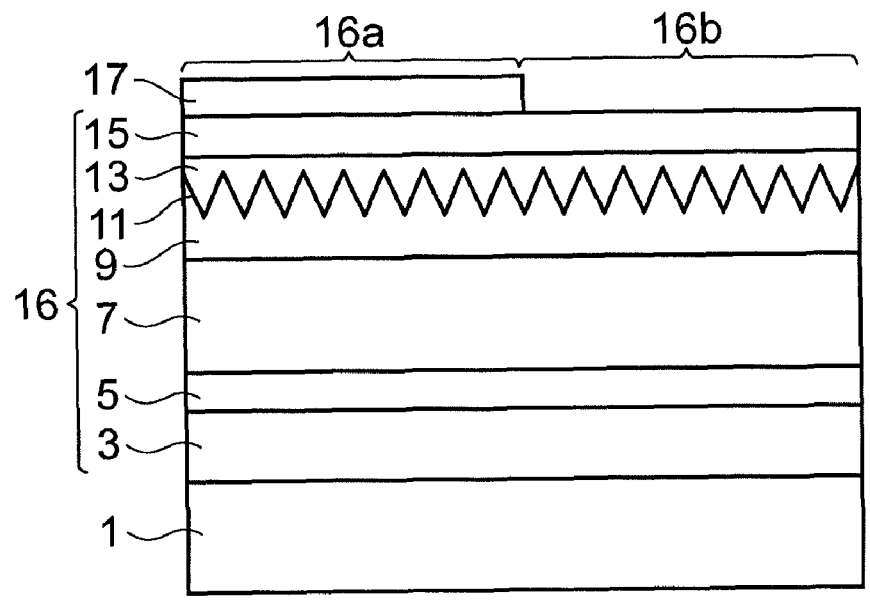
FIG. 2a is a cross-sectional view for explaining the foregoing method in succession to FIG. 1c

As can be seen from FIG. 2a, an insulating-film mask 17 is formed on the cap layer 15. More specifically, the insulating-film mask 17 is formed on the first portion 16a positioned in the LD area 1b, not on the entire surface of the cap layer 15. The insulating-film mask 17 has a thickness of, for example, 200 nm and is formed using a silicon dioxide film ($SiO_2$ film).

Figure 2B:
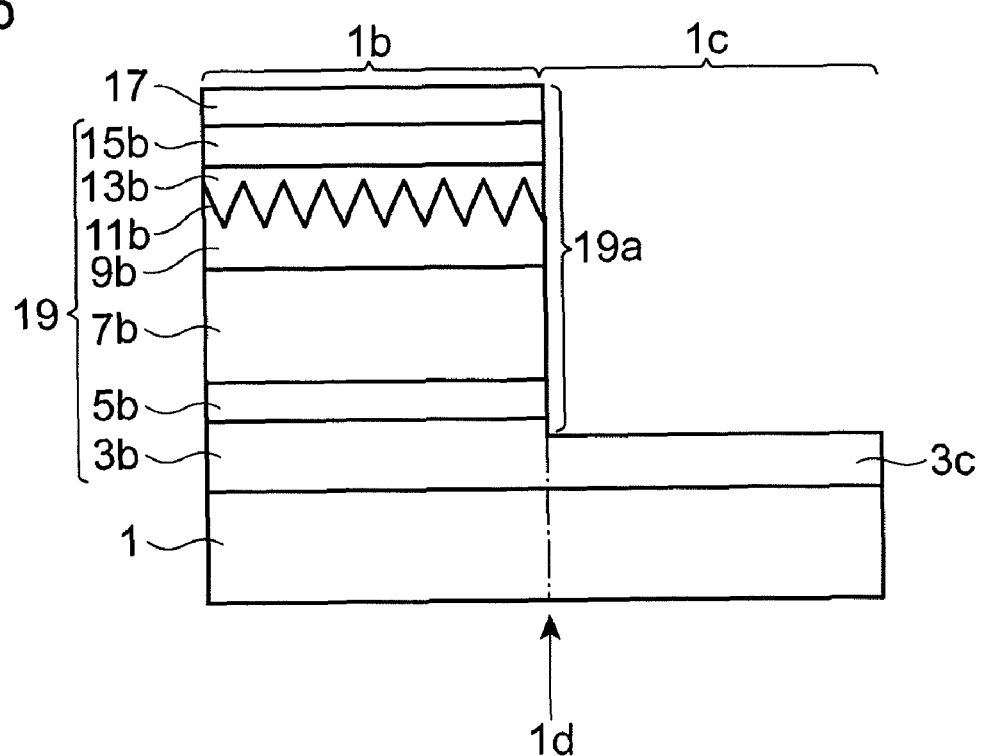

As shown in FIG. 2b, the etching of the semiconductor laminate 16 is performed using the mask 17. This etching removes the second portion 16b positioned in the EA area 1c. The removed portion of the second portion 16b includes the first optical confinement layer 5, the active layer 7, the second optical confinement layer 9, the diffraction grating 11, the cladding layer 13, and the cap layer 15 all positioned on the EA area 1c.

This etching process is performed by using the reactive-ion etching (RIE) method, for example. A mixed gas of $CH_4$ and $H_2$ is supplied into an RIE apparatus as the etching gas. The flow rate for each of the $CH_4$ and $H_2$ is 25 sccm (standard cubic centimeter per minute). The RF power is 100 W. The etching depth is about 0.8 µm. By this etching, the surface layer of the buffer layer 3 is removed to a certain extent.

When the above-described reactive-ion etching is completed, a first semiconductor portion 19 is formed on the LD area 1b. The first semiconductor portion 19 has a buffer layer 3b, a first optical confinement layer 5b, an active layer 7b, a second optical confinement layer 9b, a diffraction grating 11b, a cladding layer 13b, and a cap layer 15b. The first semiconductor portion 19 has an etched side face 19a positioned at a boundary 1d between the LD area 1b and the EA area 1c. The etched side face 19a extends in a specified direction nearly perpendicular to the main surface 1a of the InP semiconductor substrate 1.

In the example shown in FIG. 2b, a buffer layer 3c, which is a part of the buffer layer 3 and is located on the EA area 1c, is removed to a certain extent in the reactive-ion etching (RIE) process. As a result, the so-called damaged layer is formed at the upper portion of the buffer layer 3c. Therefore, it is desirable to remove the damaged layer by wet etching using sulfuric acid.

Figure 3A:
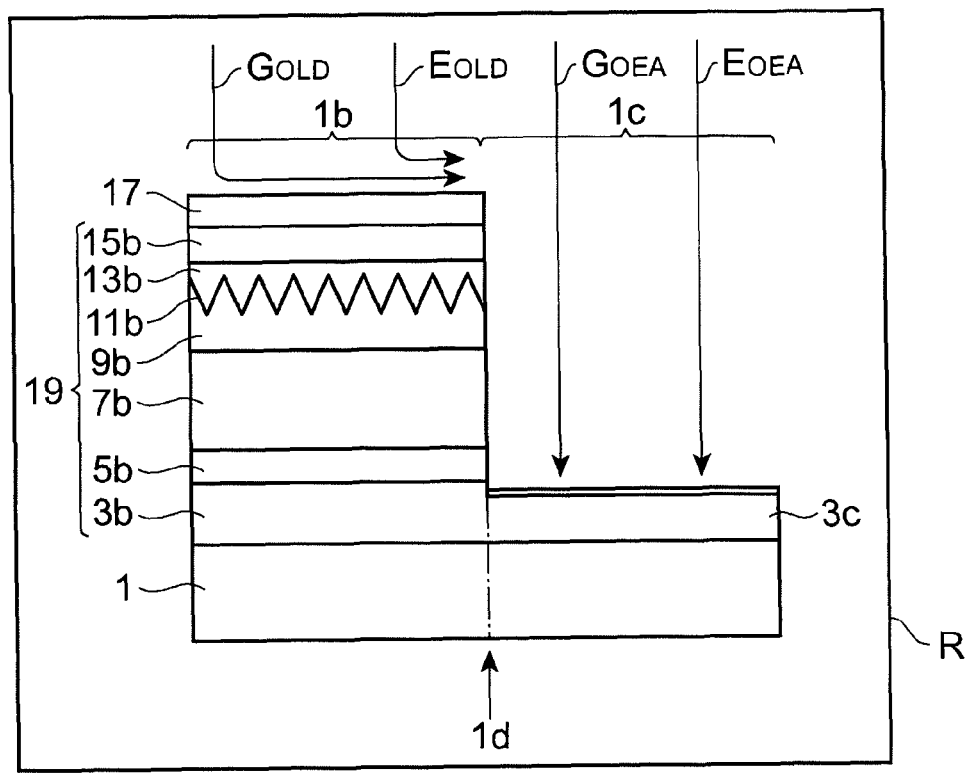
FIG. 3a is a cross-sectional view for explaining the foregoing method in succession to FIG. 2b
Figure 3B:
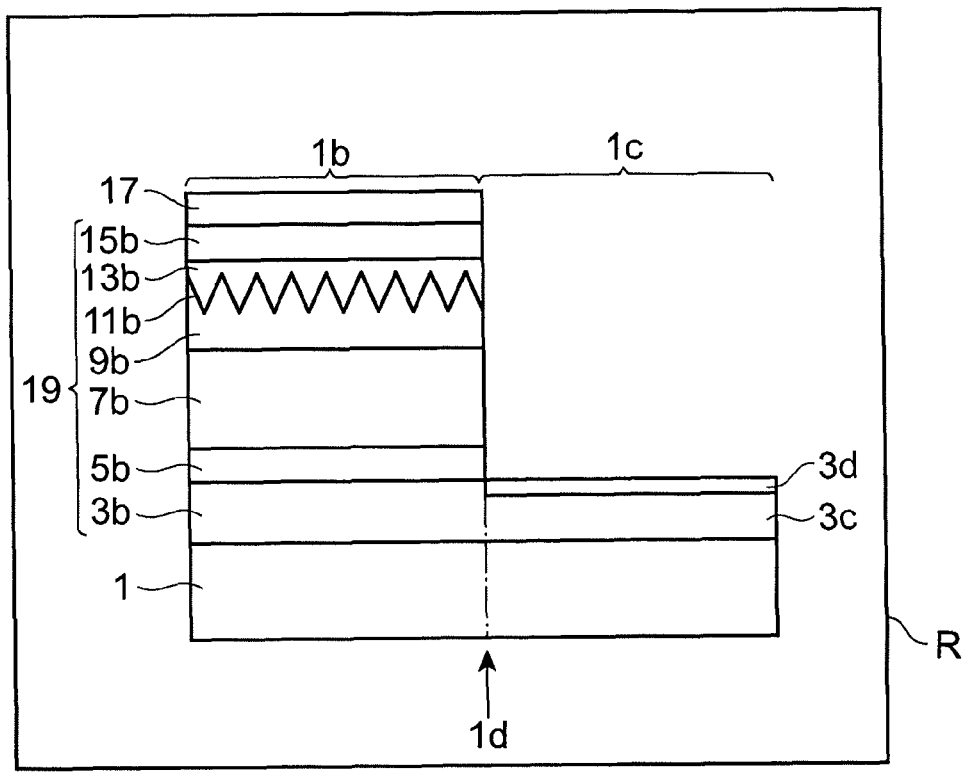

A buffer layer 3d is formed on the buffer layer 3c (see FIG. 3b). It is desirable to form the buffer layer 3d using the same material as that of the buffer layer 3c. The buffer layer 3d has a thickness of, for example, 50 nm. More specifically, the buffer layer 3d is composed of Si-doped InP and has a carrier concentration of $1.1 \times 10^{+18}$ cm$^{-3}$.

The buffer layer 3d is grown over the substrate, which is partly covered by the insulating-film layer 17, by supplying a material gas and hydrogen chloride into the metal organic vapor phase epitaxy (MOVPE) furnace. At the time the buffer layer 3d is grown, not only does the semiconductor layer grow but also the etching of the deposited semiconductor layer proceeds concurrently. At the portion in the vicinity of the side face 19a, the insulating-film mask exercises its effect. As a result, the etching rate of the deposited semiconductor layer and the growth rate of the semiconductor layer are both high and have nearly the same value. When the buffer layer 3d made of InP is grown, TMIn and PH$_3$ as the material gas and HCl are supplied in the MOVPE furnace. The buffer layer 3d is grown at a temperature of 600° C. to 640° C. For example, when a buffer layer made of InP is grown, the gas flow rates are as follows: a III-group material (TMIn): 475 sccm (1.4× 10$^{-4}$ mol/min); a V-group material (PH$_3$): 200 sccm (8.9× 10$^{-3}$ mol/min); and HCl having a concentration of 5%: 2.0 sccm (3.5×10$^{-6}$ mol/min). As a result, as shown in FIG. 3a, a semiconductor layer is grown in the EA area 1c while maintaining the form of a flat surface at the vicinity of the side face 19a.

In the LD area 1b where the insulating-film mask 17 is left unchanged, a material gas $G_{OLD}$ is not consumed on the insulating-film mask 17, because a semiconductor layer is not grown on the insulating-film mask 17. The material gas $G_{OLD}$ flows along the surface of the insulating-film mask 17 and arrives at the EA area 1c. Similarly, hydrogen chloride $E_{OLD}$ is not consumed on the insulating-film mask 17, flows along the surface of the insulating-film mask 17, and arrives at the EA area 1c. At the boundary 1d, not only does the material gas $G_{OLD}$ have a high concentration but also the hydrogen chloride $E_{OLD}$ has a high concentration. The material gas $G_{OLD}$ having arrived at the boundary 1d is consumed at the EA area 1c's portion along the boundary 1d. Similarly, the hydrogen chloride $E_{OLD}$ is also consumed at the EA area 1c's portion along the boundary 1d. Consequently, in the vicinity of the boundary 1d, the growing process of the semiconductor layer and the etching process of the deposited semiconductor layer proceed concurrently. This concurrent proceeding can suppress the so-called abnormal-growth phenomenon, in which the semiconductor layer grows abnormally at the EA area's portion along the boundary 1d and becomes thicker as the position approaches the etched side face 19a. On the other hand, in the EA area 1c's portion uncovered by the insulating-film mask 17, that is, on the flat surface of the buffer layer 3c, also, both of the material gas $G_{OEA}$ and the hydrogen chloride $E_{OEA}$ are consumed. The semiconductor layer is grown in the reactions of these gases. The growth rate of the semiconductor layer can be controlled by adjusting the ratio of the flow rates of the material gas and the hydrogen chloride, the growth temperature, and the like.

As can be seen from FIG. 3b, the buffer layer 3d having a flat surface can be formed on the buffer layer 3c without growing the semiconductor layer with an increased thickness in the vicinity of the boundary 1d. FIG. 3b shows that the abnormal growth in the vicinity of the boundary 1d can be suppressed by supplying a mixed gas of the material gas and HCl into the MOVPE furnace. Even when the buffer layer 3d is grown by supplying the mixed gas of the material gas and HCl, no HCl remains in the buffer layer 3d. In addition, the buffer layer 3d has a good crystal quality comparable to that of a semiconductor layer grown without mixing HCl.

As described above, by supplying a material gas and an etching gas such as HCl into the MOVPE furnace, a semiconductor layer is grown over the substrate that is partly covered by the insulating-film mask 17. The etching gas that is fed during the growth of the semiconductor layer is supplied not only for the EA area 1c but also for the LD area 1b. The etching gas supplied into the furnace is not consumed on the insulating-film mask 17 formed on the semiconductor laminate in the LD area 1b. The etching gas flows along the surface of the insulating-film mask 17 and arrives at the EA area 1c. The etching gas having arrived at the EA area 1c is consumed to etch the EA area 1c's portion in the vicinity of the boundary 1d.

In other words, as can be inferred from the analogy of the gas flow that causes the abnormal growth when the semiconductor layer is grown without supplying an etching gas, the gas (material gas and etching gas) flowing from the LD area 1b is supplied at the boundary 1d in addition to the gas (material gas and etching gas) directly supplied. As described above, the material gas and the etching gas are concurrently supplied at the boundary 1d. Consequently, the growing process of the semiconductor layer and the etching process of the deposited semiconductor layer proceed concurrently. This concurrent proceeding suppresses the formation of the abnormally grown layer at the side face.

As shown in FIG. 3b, the addition of the etching gas can suppress the formation of the abnormally grown layer in the vicinity of the side face, so that the buffer layer 3d having a flat surface can be grown.

In addition, as the etching gas, in place of HCl, it is also possible to use a halogen gas (for example, HBr) or a halogen-element-containing organic-compound gas, $C_aH_bX_c$ (X: Cl, Br, or another halogen element). More specifically, $C_2H_5Cl$ or tertiarybutyl chloride (TBCl) may be used.

Figure 4A:
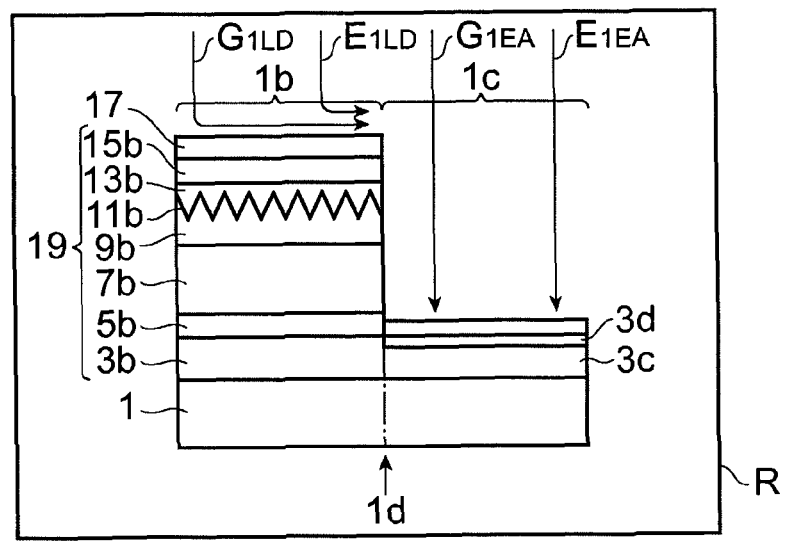
FIG. 4a is a cross-sectional view for explaining the foregoing method in succession to FIG. 3b.
Figure 4B:
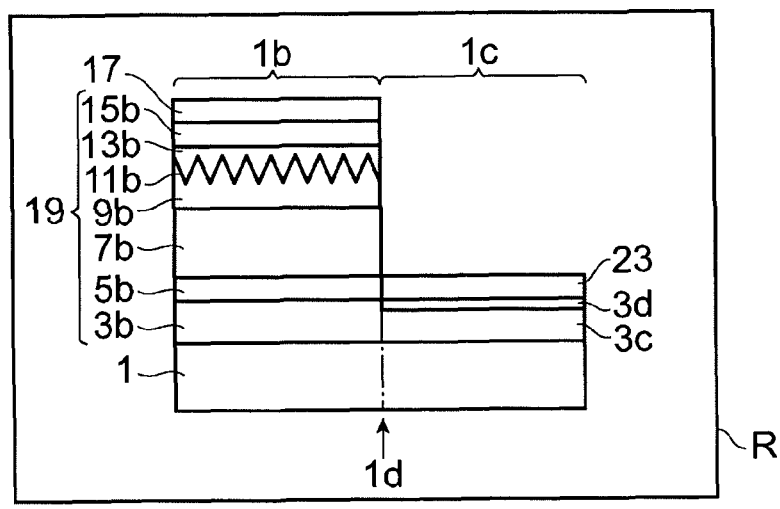
FIG. 4b is a cross-sectional view for explaining the foregoing method in succession to FIG. 4a, and FIG. 4c is a cross-sectional view for explaining the foregoing method in succession to FIG. 4b.

As can be seen from FIGS. 4a and 4b, a first optical confinement layer 23 for the EA optical modulator is grown on the buffer layer 3d. In the LD area 1b where the insulating-film mask 17 is left unchanged, a material gas $G_{1LD}$ is not consumed on the insulating-film mask 17, because a semiconductor layer is not grown on the insulating-film mask 17. The material gas GILD flows along the insulating-film mask 17 and arrives at the EA area 1c. Similarly, hydrogen chloride $E_{1LD}$ is not consumed on the insulating-film mask 17, flows along the insulating-film mask 17, and arrives at the EA area 1c. The material gas $G_{1LD}$ having arrived at the boundary 1d is consumed at the EA area 1c's portion along the boundary 1d. Similarly, the hydrogen chloride $E_{1LD}$ is also consumed at the EA area 1c's portion along the boundary 1d. Consequently, in the vicinity of the boundary 1d, the semiconductor layer is suppressed from growing with an increased thickness. Therefore, in the EA area's portion along the boundary 1d, the formation of the abnormally grown layer is suppressed at the etched side face 19a. On the other hand, in the EA area 1c where the insulating-film mask 17 is not provided, both of the material gas $G_{1EA}$ and the hydrogen chloride $E_{1EA}$ are consumed. As a result, the first optical confinement layer 23 for the EA optical modulator having a flat surface is grown on the buffer layer 3d. The growth rate of the first optical confinement layer can be controlled by adjusting the ratio of the flow rates of the material gas and the hydrogen chloride, the growth temperature, and the like.

The first optical confinement layer 23 is formed of an InGaAsP film with a bandgap wavelength of 1,150 nm, and has a thickness of, for example, 60 nm. As with the formation of the buffer layer 3d, the first optical confinement layer 23 is grown using the insulating-film mask 17 through the metal organic vapor phase epitaxy (MOVPE) method. Therefore, when the first optical confinement layer 23 is grown, it is desirable to supply hydrogen chloride in addition to the material gas for growing the first optical confinement layer 23. For example, in addition to the material gas (TMGa, TMIn, $AsH_3$, and $PH_3$) for the InGaAsP, HCl may be supplied into the MOVPE furnace. As shown in FIG. 4b, the first optical confinement layer 23 is grown on the buffer layer 3d without forming the abnormally grown layer both along the etched side face 19a and in the EA area's portion in the vicinity of the boundary 1d. As described above, when the first optical confinement layer 23 is grown, a mixed gas of the material gas and HCl is supplied into the MOVPE furnace. As with the growing-temperature range for the buffer layer, the growing-temperature range for the first optical confinement layer 23 is set within the range of 600° C. to 640° C. For example, when a first optical confinement layer made of InGaAsP with a bandgap wavelength of 1,150 nm is grown, the gas flow rate is 420 sccm for TMIn and 7.0 sccm for TMGa. In this case, the total molar flow rate for the TMIn and TMGa, both of which are III-group materials, is $1.6 \times 10^{-4}$ mol/min. The gas flow rate for $PH_3$ is 200 sccm and for $AsH_3$ is 4.0 sccm. In this case, the total molar flow rate for the $PH_3$ and $AsH_3$, both of which are V-group materials, is $9.1 \times 10^{-3}$ mol/min. HCl having a concentration of 5% is supplied at the flow rate of 2.0 sccm ($3.5 \times 10^{-6}$ mol/min). After the growing of the first optical confinement layer, an active layer 27, a second optical confinement layer 29, a cladding layer 33, and a cap layer 35 are all grown at the same predetermined mol ratio between the III-group material, the V-group material, and the HCl.

As shown in FIG. 4b, the addition of the etching gas enables the growing of the flat first optical confinement layer 23 while the abnormal growth is being suppressed. As a result of the foregoing growth process, the surface of the first optical confinement layer 23 becomes flattened.

Figure 4C:
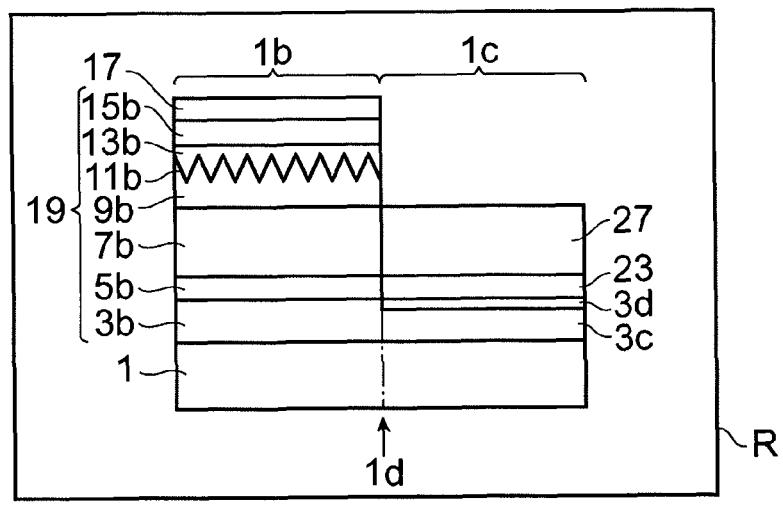

As can be seen from FIG. 4c, the active layer 27 for the EA optical modulator is grown on the first optical confinement layer 23. The active layer 27 is grown using the insulating-film mask 17 by the MOVPE method. The active layer 27 has a multiquantum well (MQW) structure and can have, for example, an InGaAsP film. The MQW structure has a plurality of barrier layers and well layers that are alternately placed. The MQW structure of the active layer 27 has a thickness of for example, 105 nm. Because the surface of the above-described first optical confinement layer 23 is flattened and the individual layers constituting the active layer 27 are thin, the bending of the individual layers is small when they are grown. In this embodiment, when the active layer 27 is grown, only the material gas for the active layer 27 is supplied without adding an etching gas. Nevertheless, when needed, an etching gas such as hydrogen chloride may be added to the material gas.

Figure 5A:
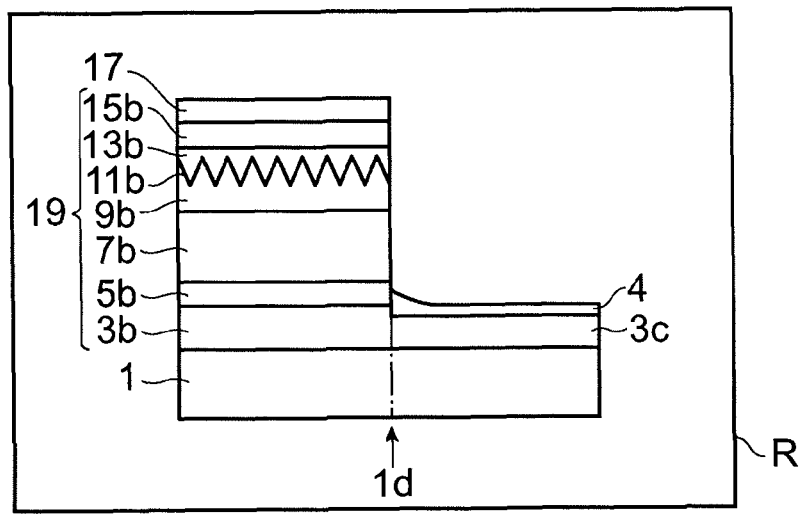
FIG. 5a is a cross-sectional view showing the abnormal growth of a buffer layer grown in an area 1c without adding an etching gas to the material gas.
Figure 5B:
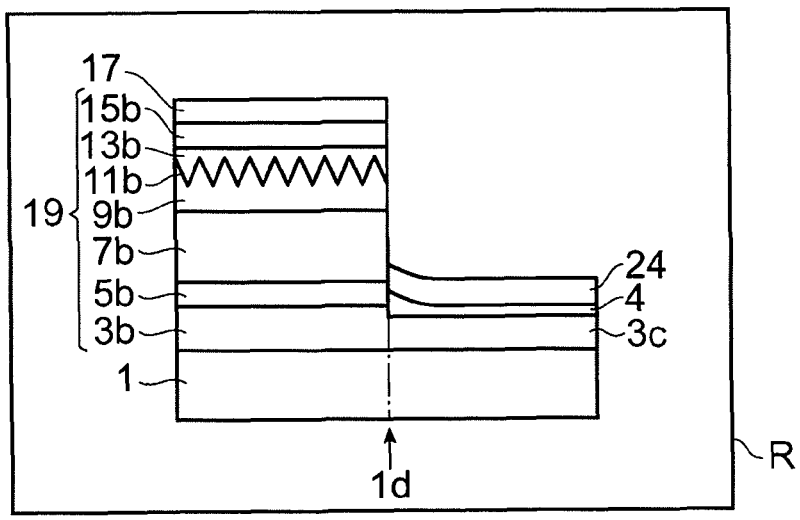
FIG. 5b is a cross-sectional view showing the abnormal growth of a first optical confinement layer grown in the area 1c without adding an etching gas to the material gas.
Figure 5C:
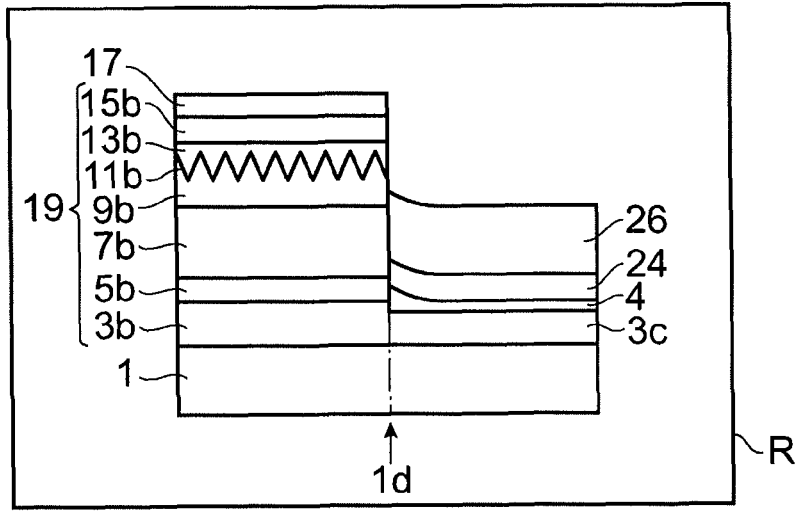
FIG. 5c is a cross-sectional view showing the abnormal growth of an active layer grown in the area 1c without adding an etching gas to the material gas.
Figure 6A:
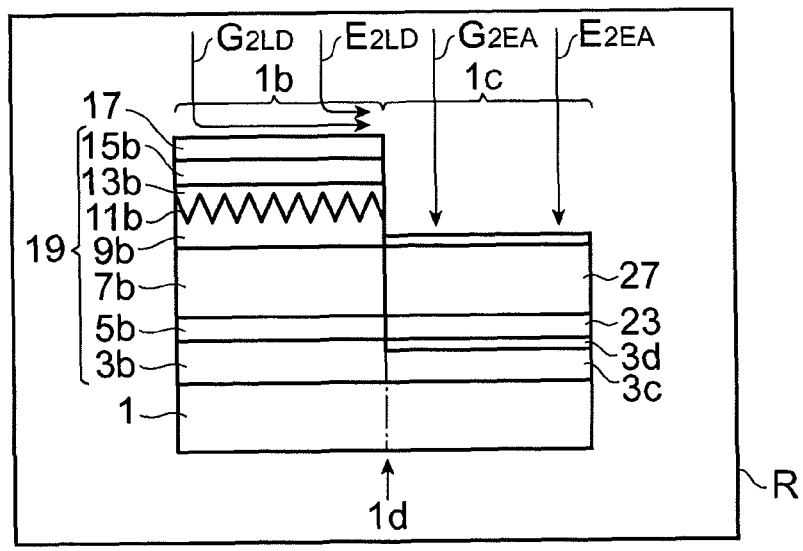
FIG. 6a is a cross-sectional view for explaining the above-described method of producing a semiconductor optical device in succession to FIG. 4c.

As shown in FIGS. 6a to 5c, when a buffer layer 4, a first optical confinement layer 24, and an active layer 26 are grown without adding an etching gas, the buffer layer 4, the first optical confinement layer 24, and the active layer 26 each form an abnormally grown layer at the boundary 1d. As a result, the first optical confinement layer 24 and the active layer 26 each produce a bending.

Figure 6B:
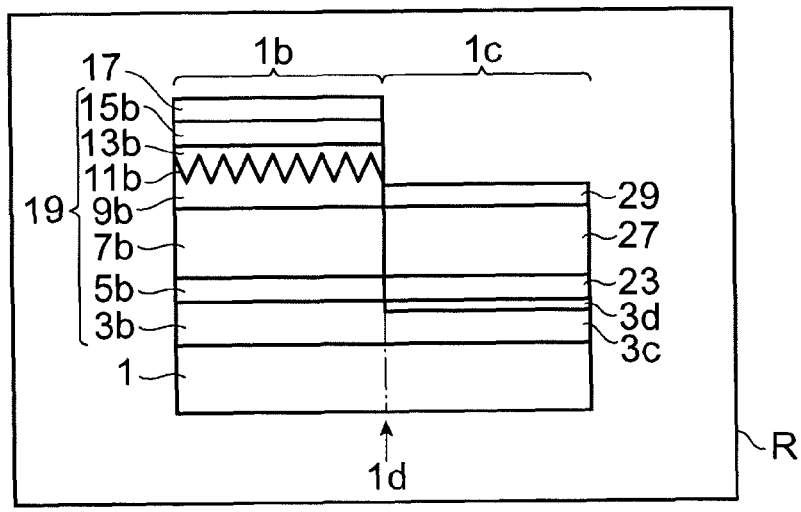
FIG. 6b is a cross-sectional view for explaining the foregoing method in succession to FIG. 6a, and FIG. 6c is a cross-sectional view for explaining the foregoing method in succession to FIG. 6b.

As can be seen from FIGS. 6a and 6b, the second optical confinement layer 29 for forming the EA optical modulator is grown on the active layer 27. In the LD area 1b covered by the insulating-film mask 17, a material gas $G_{2LD}$ is not consumed on the insulating-film mask 17, because a semiconductor layer is not grown on the insulating-film mask 17. The material gas $G_{2LD}$ flows along the insulating-film mask 17 and arrives at the EA area 1c. Similarly, hydrogen chloride $E_{2LD}$ is not consumed for film formation on the insulating-film mask 17, flows along the insulating-film mask 17, and arrives at the EA area 1c. The material gas $G_{2LD}$ and the hydrogen chloride $E_{2LD}$ both having arrived at the EA area 1c are consumed at the EA area 1c's portion along the boundary 1d. Consequently, in the vicinity of the boundary 1d, the semiconductor layer is suppressed from growing with an increased thickness. As a result, in the EA area's portion along the boundary 1d, the formation of the abnormally grown layer is suppressed at the etched side face 19a. On the other hand, in the EA area 1c uncovered by the insulating-film mask 17, both of the material gas $G_{2EA}$ and the hydrogen chloride $E_{2EA}$ are consumed to grow the semiconductor layer. The growing of the semiconductor layer can be controlled by the ratio of the flow rates of the material gas and the hydrogen chloride. The second optical confinement layer 29 is composed of, for example, an InGaAsP film with a bandgap wavelength of 1,150 nm and a thickness of, for example, 60 nm. The second optical confinement layer 29 is grown using the insulating-film mask 17 by the MOVPE method. Therefore, when the second optical confinement layer 29 is grown, it is desirable to supply hydrogen chloride in addition to the material gas. For example, in addition to the material gas (TMGa, TMIn, $AsH_3$, and $PH_3$) for the InGaAsP, HCl may be supplied into the MOVPE furnace. As shown in FIG. 6b, the second optical confinement layer 29 is grown on the active layer 27 without forming the abnormally grown layer both along the etched side face 19a and in the EA area's portion in the vicinity of the boundary 1d. The flow rate of the HCl is, for example, 2.0 sccm when the HCl is thinned to a concentration of 5%.

As shown in FIG. 6b, the addition of the etching gas enables the growing of the flat second optical confinement layer 29 while the growing of the abnormally grown layer is being suppressed. As a result of the foregoing growth process, the surface of the second optical confinement layer 29 becomes flattened.

Figure 6C:
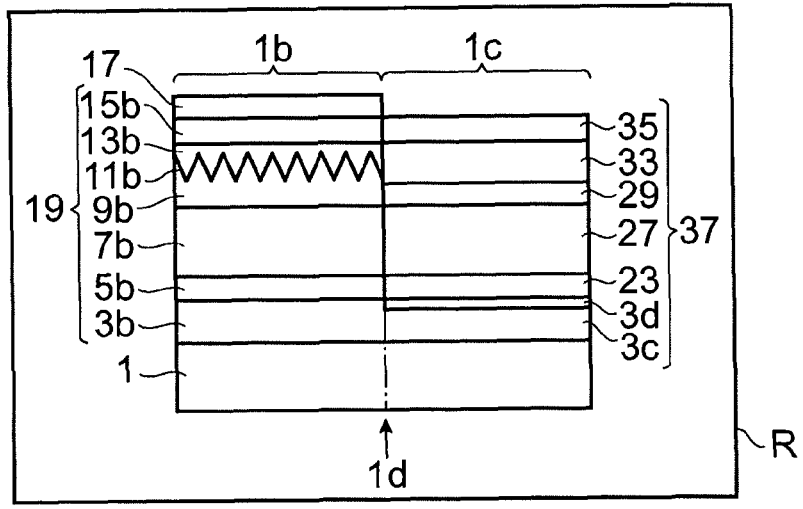

As can be seen from FIG. 6c, the cladding layer 33 and the cap layer 35 both for the EA optical modulator are grown on the second optical confinement layer 29. The cladding layer 33 is formed of a Zn-doped InP layer, has a thickness of 100 nm, and has a carrier concentration of, for example, $6.5 \times 10^{+17}$ cm$^{-3}$. The cap layer 35 is formed on the cladding layer 33. The cap layer 35 is formed of a Zn-doped InGaAs film, has a thickness of 100 nm, and has a carrier concentration of, for example, $2.0 \times 10^{+17}$ cm$^{-3}$.

The cladding layer 33 is grown using the insulating-film mask 17 by the MOVPE method. At the time the cladding layer 33 is grown, when needed, it is desirable to supply hydrogen chloride in addition to the material gas. For example, in addition to the material gas (TMIn and $PH_3$) for the InP, HCl may be supplied into the MOVPE furnace. As shown in FIG. 6c, the cladding layer 33 is grown on the second optical confinement layer 29 without forming the abnormally grown layer both along the etched side face 19a and in the EA area's portion in the vicinity of the boundary 1d. The flow rate of the HCl is, for example, 2.0 sccm when the HCl has a concentration of 5%.

As shown in FIG. 6c, the addition of the etching gas enables the growing of the flat cladding layer 33 while the growing of the abnormally grown layer is being suppressed. As a result of the foregoing growth process, the surface of the cladding layer 33 becomes flattened.

The cap layer 35 is grown using the insulating-film mask 17 by the MOVPE method. At the time the cap layer 35 is grown, when needed, it is desirable to supply hydrogen chloride in addition to the material gas. For example, in addition to the material gas (TMGa, TMIn and AsH$_3$) for the InGaAs, HCl may be supplied into the MOVPE furnace. As shown in FIG. 6c, the cap layer 35 is grown on the cladding layer 33 without forming the abnormally grown layer both along the etched side face 19a and in the EA area's portion in the vicinity of the boundary 1d. The flow rate of the HCl is, for example, 2.0 sccm when the HCl has a concentration of 5%.

As shown in FIG. 6c, the addition of the etching gas enables the growing of the flat cap layer 35 while the growth of the abnormally grown layer is being suppressed. As a result of the foregoing film formation, the surface of the cap layer 35 becomes flattened.

As described above, the growth of the semiconductor films for the EA optical modulator forms a second semiconductor portion 37 on the EA area 1c. The second semiconductor portion 37 has the buffer layers 3c and 3d, the first optical confinement layer 23, the active layer 27, the second optical confinement layer 29, the cladding layer 33, and the cap layer 35. The second semiconductor portion 37 is jointed with the first semiconductor portion 19 at the boundary 1d. In particular, the active layer 7b of the first semiconductor portion 19 is optically coupled with the active layer 27 of the second semiconductor portion 37 through the butt-joint structure.

As explained above, an etching gas is added to the material gas to grow the individual layers of the second semiconductor portion 37 formed on the EA area 1c. Consequently, the formation of the abnormally grown layer is suppressed and therefore the surface of the individual layers is flattened. As a result, the deviation of the position is small between the active layer 7b for the laser diode and the active layer 27 for the EA optical modulator.

In order to optically couple the active layer 7b with the active layer 27 for the EA optical modulator, the height (position) of the active layer 7b from the substrate is required to be precisely coincident with that of the active layer 27 for the EA optical modulator. When a semiconductor layer is grown by adding an etching gas to the material gas, the growth rate of the semiconductor layer is changed in dependence on the flow rate of the etching gas. The variation range of the growth rate tends to increase as the flow rate of the etching gas increases. Therefore, it is important to obtain the relationship between the flow rate of HCl as the etching gas and the growth rate in advance. The flow rate of the HCl is employed in the range of being stable growth rate. In the case where HCl with a concentration of 5% is used, when the flow rate of the HCl is, for example, 20 sccm or less, the growth rate of the semiconductor layer is stabilized. In addition, in order to precisely control the growth rate, when the individual layers of the second semiconductor portion 37 to be grown on the EA area 1c are grown, the growth rate is reduced. More specifically, the growth rate of the individual layers of the second semiconductor portion 37 to be grown on the EA area 1c is set within the range of 0.75 to 0.85 μm/hr.

Figure 7A:
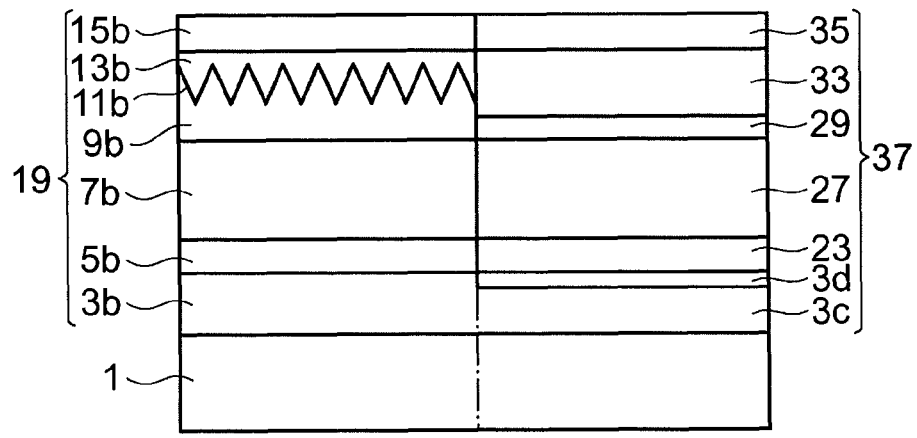
FIG. 7a is a cross-sectional view for explaining the foregoing method in succession to FIG. 6c.
Figure 7B:
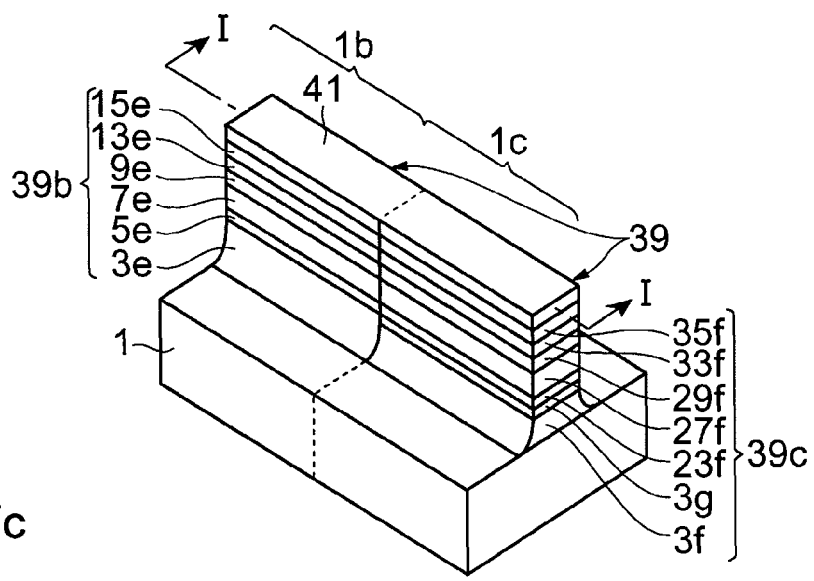
FIG. 7b is a perspective view for explaining the foregoing method in succession to FIG. 7a, and FIG. 7c is a perspective view for explaining the foregoing method in succession to FIG. 7b.

As shown in FIG. 7a, after the individual layers of the second semiconductor portion 37 are grown on the EA area 1c, the insulating-film mask 17 is removed. FIG. 7b is a perspective view showing a part of the substrate in the process of producing the laser diode. The cross section in the production process shown in FIG. 7a is obtained as the vertical plane passing through the line I-I shown in FIG. 7b. The same is applied to the cross sections in the production process shown in FIGS. 1a to 6c.

As can be seen from FIG. 7b, to form an optical waveguide portion 39b and an optical waveguide portion 39c, a mask 41 is formed on the first semiconductor portion 19 and the second semiconductor portion 37. The mask 41 has the shape of a stripe. The mask 41 is formed of an insulating film, such as a silicon dioxide film (SiO$_2$ film) or a silicon nitride film (SiN film).

As shown in FIG. 7b, a stripe mesa 39 is formed along the axis drawn from the LD area 1b to the EA area 1c so as to function as an optical waveguide. The stripe mesa 39 has the optical waveguide portion 39b on the LD area 1b and the optical waveguide portion 39c on the EA area 1c. To form the optical waveguide portions 39b and 39c, the first semiconductor portion 19 and the second semiconductor portion 37 are etched using the mask 41 until the main surface 1a of the InP semiconductor substrate 1 is exposed. The stripe mesa 39 is formed by this etching process. The optical waveguide portion 39b has a buffer layer 3e, a first optical confinement layer 5e, an active layer 7e, a second optical confinement layer 9e, a cladding layer 13e, and a cap layer 15e. These layers are positioned on the LD area 1b. Similarly, the optical waveguide portion 39c has buffer layers 3f and 3g, a first optical confinement layer 23f, an active layer 27f, a second optical confinement layer 29f, a cladding layer 33f, and a cap layer 35f. These layers are positioned on the EA area 1c.

Figure 7C:
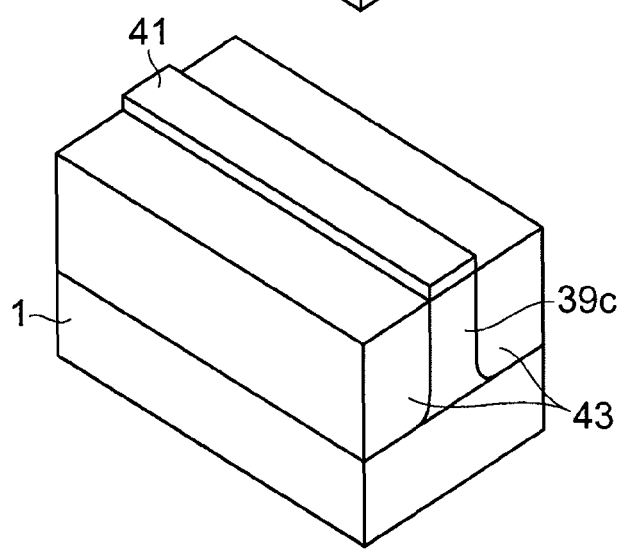

As shown in FIG. 7c, the mesa having the optical waveguide portions 39b and 39c is embedded by buried layers 43. The mask 41 is used to form the buried layers 43. Thus, the buried layers 43 composed of, for example, Fe-doped InP semiconductor are grown on the InP semiconductor substrate. Then, the mask 41 is removed.

Figure 8A:
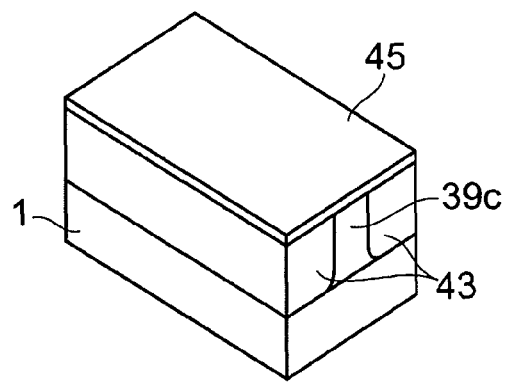
FIG. 8a is a perspective view for explaining the foregoing method in succession to FIG. 7c.

As can be seen from FIG. 8a, a contact layer 46 formed of a Zn-doped InGaAs semiconductor layer is grown both on the mesa 39 having the optical waveguide portions 39b and 39c and on the buried layers 43.

Figure 8B:
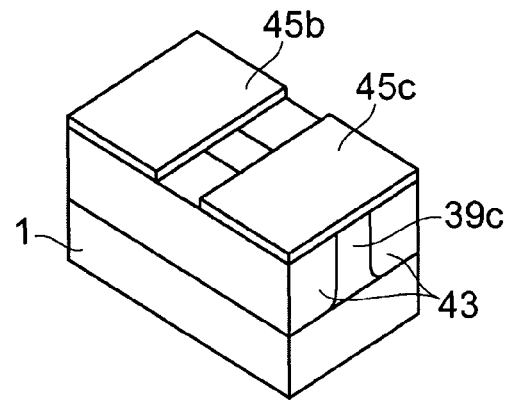
FIG. 8b is a perspective view for explaining the foregoing method in succession to FIG. 8a, FIG. 8c is a perspective view for explaining the foregoing method in succession to FIG. 8b.

Next, as shown in FIG. 8b, a contact layer 46b of the laser diode and a contact layer 45c of the EA optical modulator are formed. To form the contact layers 46b and 46c, the contact layer's portion in the vicinity of the boundary 1d is removed, and the separated region is formed between the laser diode and the EA optical modulator. More specifically, the contact layer 46's portion is removed from the area extending in a direction perpendicular to the axis drawn from the optical waveguide portion 39b to the optical waveguide portion 39c. This separated region separates the contact layer 45b from the contact layer 45c. This separated region enables the electrical isolation between the laser diode and the EA optical modulator.

Figure 8C:
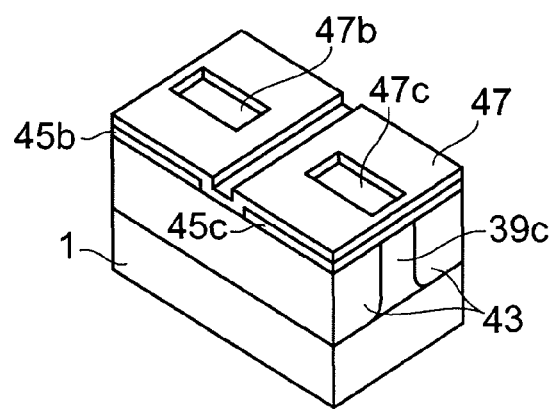
FIG. 8d is a perspective view for explaining the foregoing method in succession to FIG. 8c.

As shown in FIG. 8c, an insulating film 47 is provided on the entire surface of the optical waveguide portions 39b and 39c, buried layers 43, and the contact layers 46b and 46c. The insulating film 47 may be formed of, for example, a silicon dioxide film (SiO$_2$ film) or a silicon nitride film (SiN film).

The insulating film 47 is provided with openings 47b and 47c on the contact layers 45b and 46c, respectively.

Figure 8D:
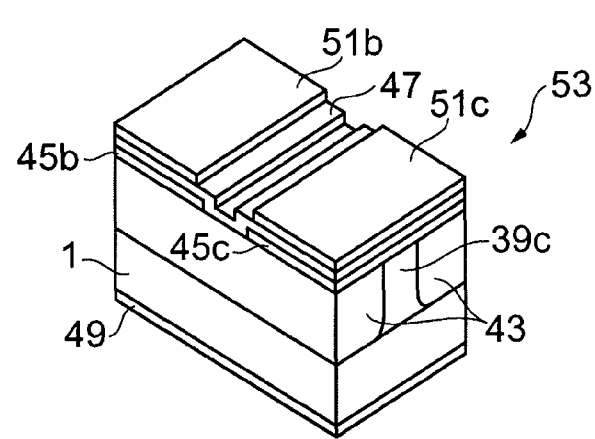

As shown in FIG. 8d, on the insulating film 47, an anode 51b of the laser diode and an anode 51c of the EA optical modulator are formed such that they fill the openings 47b and 47c, respectively. At the openings 47b and 47c, the anodes 61b and 51c are directly in contact with the contact layers 45b and 45c, respectively, to establish electric connections.

A cathode 49 is formed on the undersurface of the InP semiconductor substrate 1. The above-described steps complete the production of a semiconductor optical device 53 shown in FIG. 8d.

This embodiment extremely decreases the abnormal growth phenomenon in which the semiconductor layer's portion growing along the etched side face 19a of the first semiconductor portion 19 grows thicker than does the semiconductor layer's portion growing on the flat substrate. More specifically, the abnormal growth along the side face 19a is significantly small at the time of the growing of the buffer layer 3d and the first optical confinement layer 23, both of which grow before the growing of the active layer. Therefore, the active layer 27 for the EA optical modulator can be suppressed from bending due to the abnormal growth of the semiconductor layer. As a result, the optical-coupling loss between the active layer 7b for the laser diode and the active layer 27 for the EA optical modulator can be prevented from increasing due to the bending of the active layer 27.

In addition, with all of the second optical confinement layer 29, the cladding layer 33, and the cap layer 35, also, by performing the etching and the growing concurrently, the bending of the semiconductor layer at the boundary caused by the abnormally grown portion can be decreased.

Furthermore, in the early stage of the growing process of the semiconductor for the EA optical modulator, the etching is carried out concurrently in the MOVPE furnace to suppress the generation of the abnormal growth. Consequently, the effect of removing the oxide layer formed on the surface of the substrate can also be expected.

As a result, when a semiconductor layer is grown on the semiconductor substrate, it becomes possible to grow a semiconductor layer having a good crystal quality.

As described above, the addition of an etching gas to the material gas decreases the bending of the semiconductor layer, so that the surface of the semiconductor layer becomes flattened. This flattening can prevent the deterioration of the properties of the semiconductor optical device 53 caused by the bending of the semiconductor layer resulting from the abnormal growth.

The principle of the present invention is illustrated and explained above by referring to desirable embodiments. It is to be understood by those skilled in the art that the present invention can be modified with respect to the configuration and details without deviating from the above-described principle. In other words, the present invention is not limited to the specific constitution disclosed in the above-described embodiments. Accordingly, the present invention demands right not only in the scope of the appended claims but also in all revisions and modifications based on the spirit and scope of the claims.

What is claimed is:

1. A method of producing an integrated semiconductor optical device, the method comprising the steps of:
   (a) preparing a substrate having a main surface having:
      (a1) a first area for forming a first semiconductor optical device to be included in the integrated semiconductor optical device; and
      (a2) a second area for forming a second semiconductor optical device to be included in the integrated semiconductor optical device;
   (b) forming on the substrate a semiconductor laminate for forming the first semiconductor optical device;
   (c) forming an insulating-film mask on the semiconductor laminate on the first area;
   (d) etching the semiconductor laminate by using the insulating-film mask to form on the first area a first semiconductor portion having a side face extending in a specified direction perpendicular to the main surface;
   (e) after the etching of the semiconductor laminate, selectively growing a first semiconductor layer for the second semiconductor optical device through a metal organic vapor phase epitaxy method while leaving the insulating-film mask unchanged; and
   (f) while leaving the insulating-film mask unchanged, selectively growing on the first semiconductor layer a second semiconductor layer for the second semiconductor optical device;
   wherein in growing the first semiconductor layer, an etching gas containing a halogen element is supplied in addition to a material gas for the growing of the first semiconductor layer.

2. A method of producing an integrated semiconductor optical device according to claim 1, wherein in the step of growing the first semiconductor layer, the mixing ratio of the material gas and the etching gas containing a halogen element is controlled to grow a semiconductor layer having a flat surface.

3. A method of producing an integrated semiconductor optical device according to claim 1, wherein in the step of growing the first semiconductor layer, the first semiconductor layer is grown at a temperature of 600° C. to 640° C.

4. A method of producing an integrated semiconductor optical device according to claim 1, wherein the first semiconductor layer for the second semiconductor optical device comprises a buffer layer.

5. A method of producing an integrated semiconductor optical device according to claim 4, wherein the buffer layer for the second semiconductor optical device is made of InP.

6. A method of producing an integrated semiconductor optical device according to claim 1, wherein the first semiconductor layer for the second semiconductor optical device comprises an optical confinement layer.

7. A method of producing an integrated semiconductor optical device according to claim 6, wherein the optical confinement layer for the second semiconductor optical device is made of InGaAsP.

8. A method of producing an integrated semiconductor optical device according to claim 1, wherein the second semiconductor layer for the second semiconductor optical device is an active layer.

9. A method of producing an integrated semiconductor optical device according to claim 8, wherein the active layer for the second semiconductor optical device has a multiquantum well structure made of InGaAsP.

10. A method of producing an integrated semiconductor optical device according to claim 1, wherein in the step of growing the second semiconductor layer, the second semiconductor layer is grown by a metal organic vapor phase epitaxy method and an etching gas containing a halogen element is supplied in addition to a material gas for the growing of the second semiconductor layer.

11. A method of producing an integrated semiconductor optical device according to claim 1, the method further comprising a step of growing on the second semiconductor layer a third semiconductor layer for the second semiconductor optical device by a metal organic vapor phase epitaxy method;
   wherein in growing the third semiconductor layer, an etching gas containing a halogen element is supplied in addition to a material gas for the growing of the third semiconductor layer.

12. A method of producing an integrated semiconductor optical device according to claim 1, wherein the semiconductor laminate comprises an active layer for the first semiconductor optical device.

13. A method of producing an integrated semiconductor optical device according to claim 12, wherein the active layer for the first semiconductor optical device has a multiquantum well structure made of InGaAsP.

14. A method of producing an integrated semiconductor optical device according to claim 1, wherein:
(a) one of the first and second semiconductor optical devices comprises a laser diode and the other one comprises an electroabsorption optical modulator; and
(b) the first and second semiconductor optical devices are optically coupled together with a butt-joint structure.

15. A method of producing an integrated semiconductor optical device according to claim 1, wherein as the etching gas containing a halogen element, hydrogen chloride is used.

16. A method of producing an integrated semiconductor optical device according to claim 15, wherein hydrogen chloride having a concentration of 5% is supplied at a flow rate of equal to or less than 20 sccm.

* * * * *